United States Patent
Wu et al.

(10) Patent No.: US 11,226,352 B2
(45) Date of Patent: Jan. 18, 2022

(54) ELECTRICAL CONNECTION ASSEMBLY

(71) Applicant: C.C.P.CONTACT PROBES CO.,LTD., New Taipei (TW)

(72) Inventors: Shu-Lin Wu, New Taipei (TW); Yen-Wei Lin, New Taipei (TW); Wei-Chu Chen, New Taipei (TW); Bor-Chen Tsai, New Taipei (TW)

(73) Assignee: C.C.P.CONTACT PROBES CO., LTD., New Taipei (TW)

( * ) Notice: Subject to any disclaimer, the term of this patent is extended or adjusted under 35 U.S.C. 154(b) by 7 days.

(21) Appl. No.: 16/823,434

(22) Filed: Mar. 19, 2020

(65) Prior Publication Data

US 2020/0379008 A1     Dec. 3, 2020

(30) Foreign Application Priority Data

Jun. 3, 2019   (TW) .................................. 108119126

(51) Int. Cl.
  *G01R 1/067*   (2006.01)
  *H01R 13/24*   (2006.01)
  *H01L 21/00*   (2006.01)

(52) U.S. Cl.
  CPC ..... *G01R 1/06722* (2013.01); *H01R 13/2421* (2013.01); *H01R 2201/20* (2013.01)

(58) Field of Classification Search
  CPC ....... H01L 21/00; H01L 2221/00; G01R 1/00; H01R 3/00; H01R 2101/00
  See application file for complete search history.

(56) References Cited

U.S. PATENT DOCUMENTS

| | | | | |
|---|---|---|---|---|
| 4,774,462 | A  * | 9/1988 | Black | G01R 1/04 |
| | | | | 324/754.03 |
| 2015/0247882 | A1* | 9/2015 | Lee | G01R 1/06722 |
| | | | | 324/755.05 |
| 2015/0276807 | A1* | 10/2015 | Chen | G01R 1/06722 |
| | | | | 324/755.05 |
| 2017/0097376 | A1* | 4/2017 | Chou | G01R 1/06722 |
| 2017/0122978 | A1* | 5/2017 | Li | G01R 1/06722 |
| 2017/0192036 | A1* | 7/2017 | Tsai | G01R 31/2884 |

* cited by examiner

*Primary Examiner* — Jermele M Hollington
*Assistant Examiner* — Temilade S Rhodes-Vivour
(74) *Attorney, Agent, or Firm* — Li & Cai Intellectual Property (USA) Office

(57) ABSTRACT

An electrical connection assembly includes a main body and a spring. One end of the main body is configured to be in contact with a device under test. The spring is sleeved around the main body. Two ends of the spring are respectively defined as a first end and a second end. The first end is abutted against a limiting protrusion, and a concealed section of the main body is correspondingly arranged inside of the spring. The spring has a first tightly-coiled section, an elastic section, and a second tightly-coiled section in sequence from the first end to the second end. A pitch of the spring within the elastic section is greater than a pitch of the spring within the first tightly-coiled section, and the pitch of the spring within the elastic section is greater than a pitch of the spring within the second tightly-coiled section.

6 Claims, 7 Drawing Sheets

ELECTRICAL CONNECTION ASSEMBLY

CROSS-REFERENCE TO RELATED PATENT APPLICATION

This application claims the benefit of priority to Taiwan Patent Application No. 108119126, filed on Jun. 3, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electrical connection assembly, and more particularly to an electrical connection assembly for testing electrical components.

BACKGROUND OF THE DISCLOSURE

Generally, each type of electrical components or electrical products would undergo related electrical property tests before leaving factory so as to ensure that the electrical components or electrical products comply with a relevant specification.

Referring to FIG. 1, FIG. 1 shows a conventional probe assembly 10 for testing electrical components. The probe assembly 10 includes a shell 101, two contacting members 102, 103, and a spring 104. The two contacting members 102, 103, and the spring 104 are disposed in the shell 101, and the spring 104 is between the two contacting members 102, 103. The spring 104 is abutted against the two contacting members 102, 103 so that the two contacting members 102, 103 partially protrude from the shell 1. When the probe assembly 10 is used for testing, the two contacting members 102, 103 protrude from the shell 101 to be respectively in contact with a device under test and a related testing device. The related testing device can test an electrical property state of the device under test through the probe assembly 10. In a practical application, since the probe assembly 10 shown in FIG. 1 includes too many components, an assembling process thereof is complicated. Therefore, the production cost thereof is high.

Referring to FIG. 2, FIG. 2 shows a probe assembly 11. Although the structure of the probe assembly 11 is simpler than the structure of the probe assembly 10, other defects are present in the probe assembly 11. The probe assembly 11 includes a pin body 111 and a spring 112. A contacting structure 1121 extends from an end of the spring 112, and the probe assembly 11 and a pad S1 of a circuit board S are fixed with each other through the contacting structure 1211.

In a practical application, since an end surface of an end of the contacting structure 1121 of the probe assembly 11 shown in FIG. 2 is small, an issue of the contacting structure 1121 and the pad S1 being incorrectly fixed with each other can easily occur when fixing the contacting structure 1121 to the pad S1 of the circuit board S. Moreover, since the contacting structure 1121 is presented as a rod structure, when the end of the contacting structure 1121 and the pad S1 are being fixed with each other, a force sustained by the contacting structure 1121 at the end correspondingly generates a torque at a connection position 1121A between the contacting structure 1121 and the spring 112. The torque may result in a fracture issue at the connection position 1121A between the contacting structure 1121 and the spring 112.

SUMMARY OF THE DISCLOSURE

In response to the above-referenced technical inadequacies, the present disclosure provides an electrical connection assembly to improve on the issues associated with high production cost of conventional probe assemblies that include too many components and is with a complicated assembly process. The electrical connection assembly in the present disclosure further improves on the fracture issue which can easily occur at a contacting structure of the conventional probe assembly, and the contacting structure is configured to be fixed with a pad of a device under test.

In one aspect, the present disclosure provides an electrical connection assembly including a main body and a spring. The main body is a conductive rod structure. Two ends of the main body are respectively defined as a contacting end and a tail end, the contacting end is configured to be in contact with a device under test, the main body has a limiting protrusion near the contacting end, and the limiting protrusion divides the main body into an exposed section and a concealed section. The spring is a conductive structure and is sleeved around the main body. Two ends of the spring are respectively defined as a first end and a second end, the first end is abutted against the limiting protrusion, and the concealed section of the main body is correspondingly arranged inside of the spring. The spring has a first tightly-coiled section, an elastic section, and a second tightly-coiled section in sequence from the first end to the second end. A pitch of the spring within the elastic section is greater than a pitch of the spring within the first tightly-coiled section, and the pitch of the spring with the elastic section is greater than a pitch of the spring within the second tightly-coiled section. An outer diameter of the spring is within a range of 0.05 mm to 3 mm. The spring is formed by a wire body spirally rotating relative to a central axis, an end of the wire body bends toward the central axis to form an end portion, and the end portion is arranged at a position of the second tightly-coiled section away from the first end of the spring. When one end of the spring is fixed and another end of the spring is pressed, the elastic section elastically deforms, and when the spring is no longer pressed, an elastic returning force generated by the elastic section allows the spring to return to an initial position.

Therefore, the structure of the electrical connection assembly in the present disclosure is simple so that the assembly process can be simpler and the production cost can be reduced. Compared to the contacting structure extending out of a spring of the conventional electrical connection assembly (as shown in FIG. 2), in the present disclosure, the end portion of the electrical connection assembly configured to be fixed with a contacting portion of a circuit board has a stronger structure, so that when the end portion is being fixed with the contacting portion of the circuit board, a fracture issue does not easily occur. Moreover, compared to the contacting structure extending out of the spring of the conventional electrical connection assembly (as shown in FIG. 2), the end portion has a larger contacting area to be easily and correctly fixed with the contacting portion.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
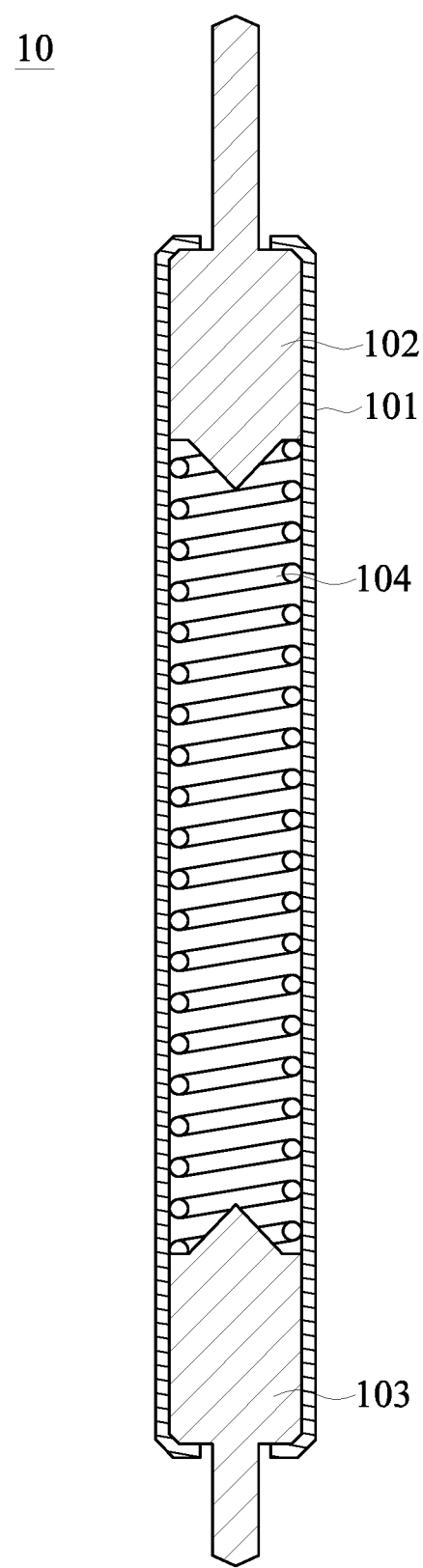
FIG. 1 and FIG. 2 are cross-sectional views of conventional probe assemblies.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 3:
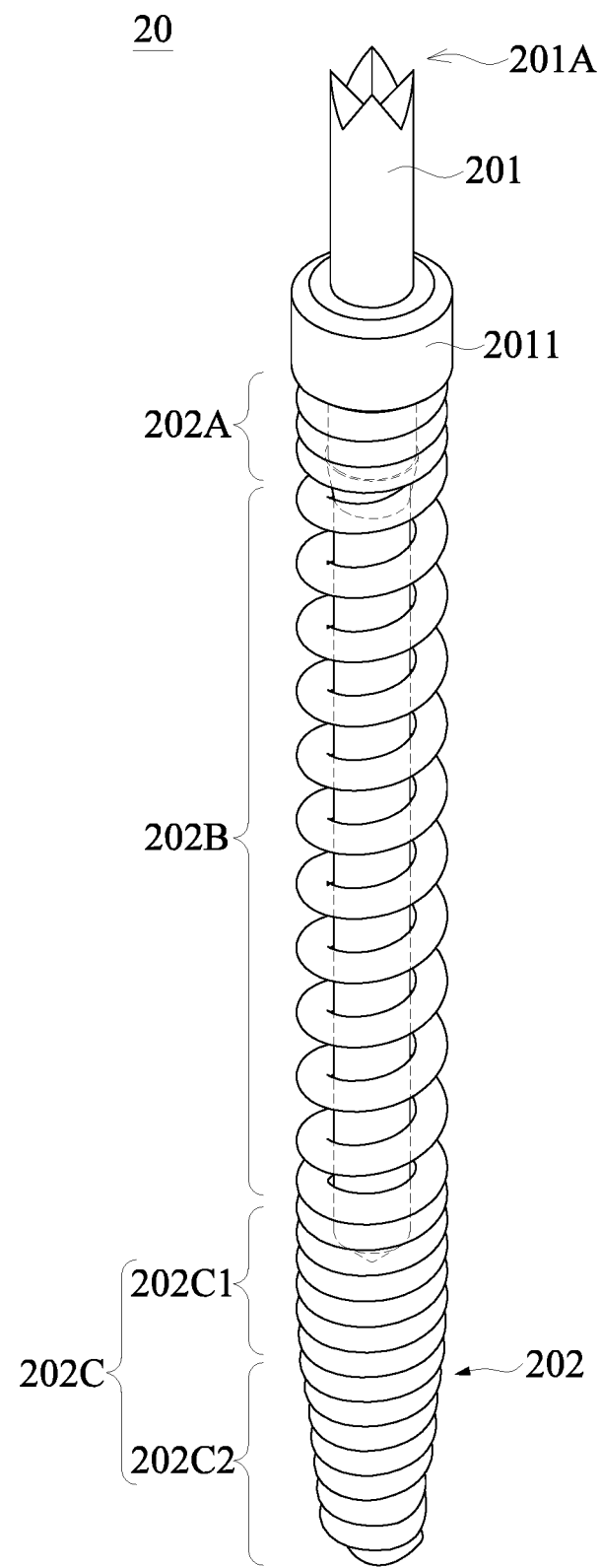
FIG. 3 is an assembled view of an electrical connection assembly of the present disclosure.
Figure 4:
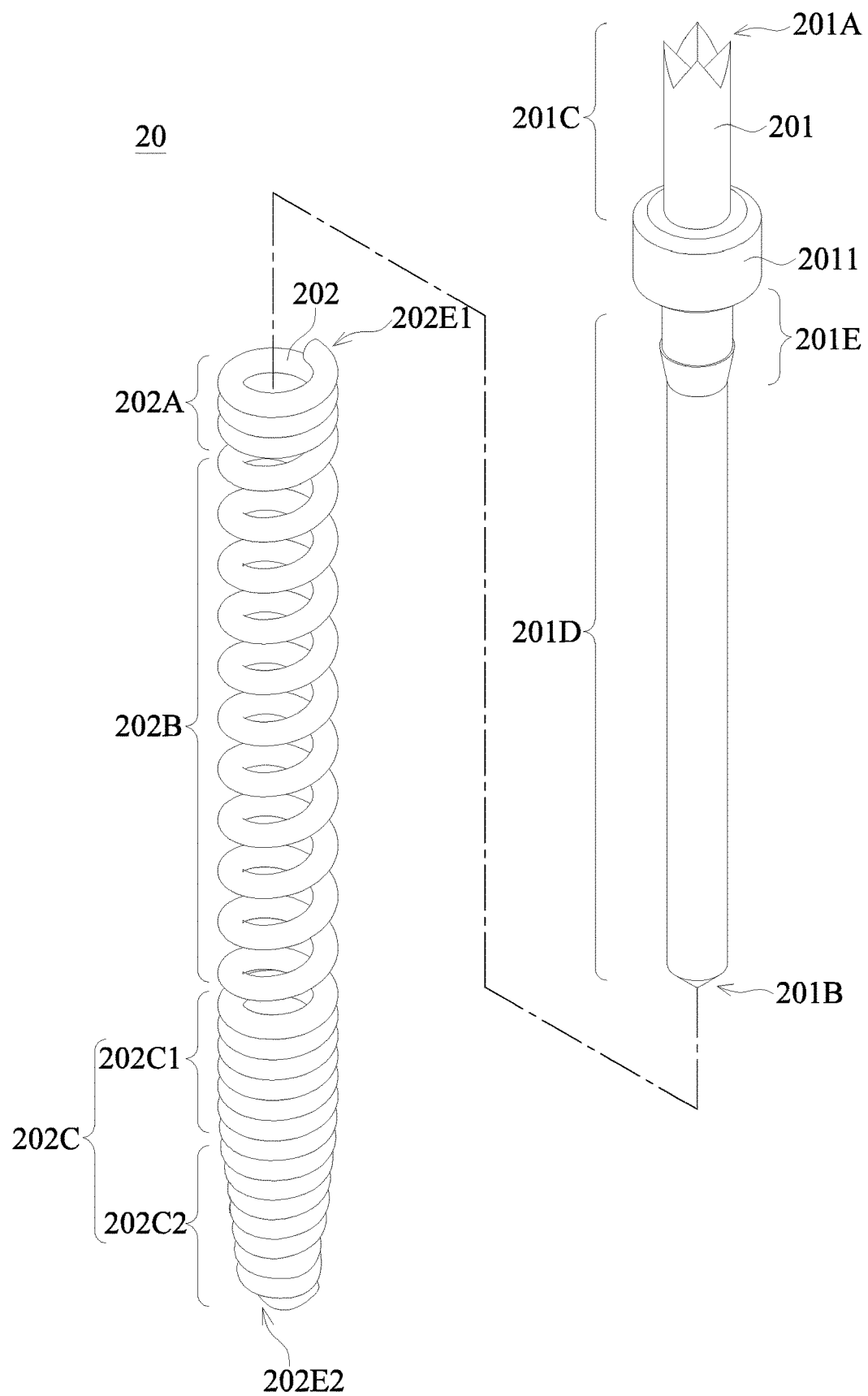
FIG. 4 is an exploded view of the electrical connection assembly of the present disclosure.
Figure 5:
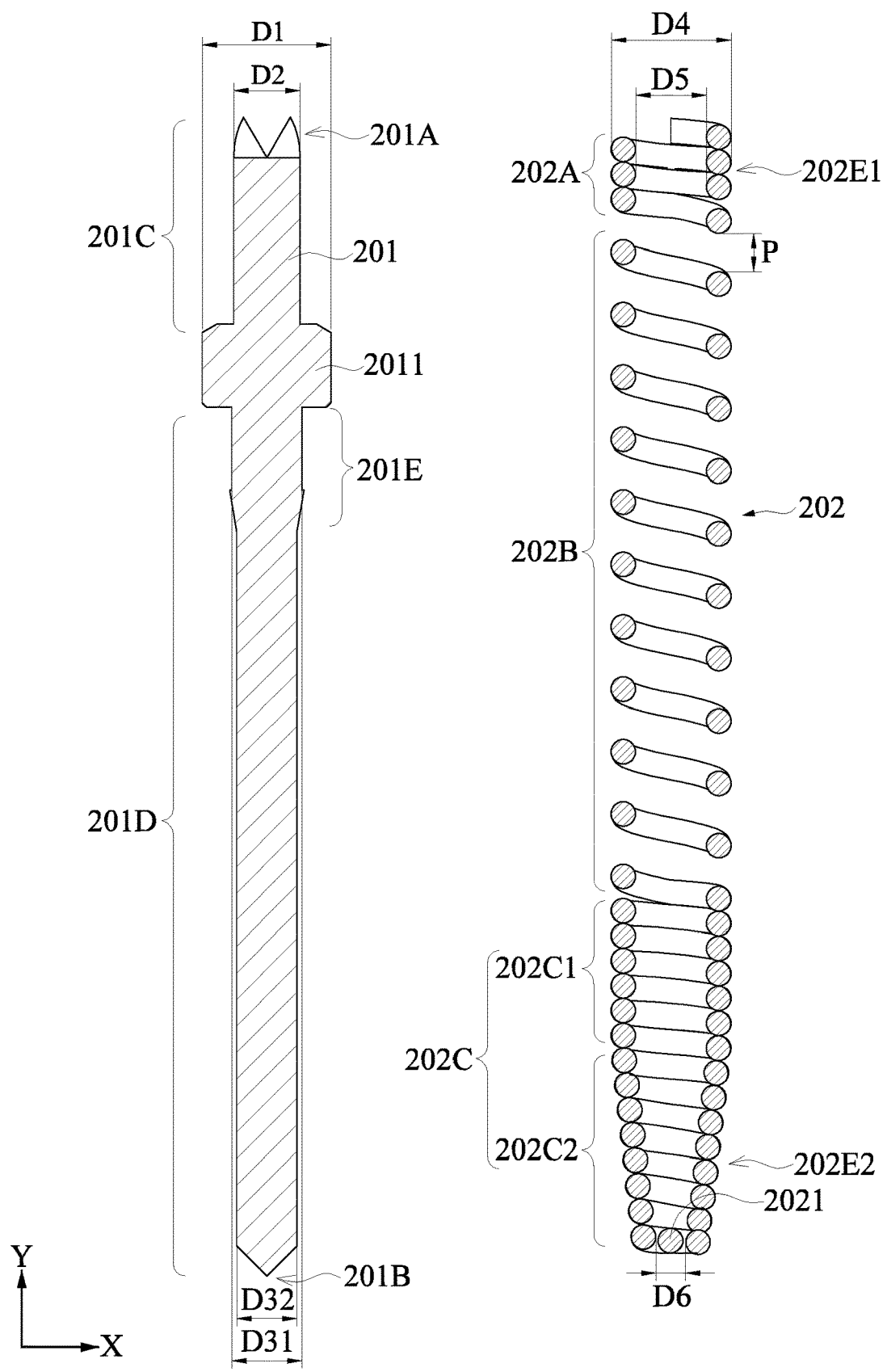
FIG. 5 is an exploded cross-sectional view of the electrical connection assembly of the present disclosure.

Referring to FIG. 3 to FIG. 5, FIG. 3 is an assembled view of an electrical connection assembly of the present disclosure. FIG. 4 is an exploded view of the electrical connection assembly of the present disclosure. FIG. 5 is an exploded cross-sectional view of the electrical connection assembly of the present disclosure. The electrical connection assembly 20 includes a main body 201 and a spring 202. In a practical application, one end of the electrical connection assembly 20 is configured to be fixed onto a circuit board, and another end of the electrical connection assembly 20 is configured to be in contact with a device under test (e.g. each type of chips, sensors). Therefore, through the electrical connection assembly, related processors connected to the circuit board can determine a related electrical property state of the device under test in contact with the electrical connection assembly 20. For example, the electrical connection assembly 20 of the present disclosure is configured to test an open/short state of electrical components. In a practical application, a plurality of the electrical connection assemblies 20 can be fixed in an electrical connection socket. The electrical connection socket is fixed onto the circuit board and is configured to carry a chip (e.g. memory chip), and the electrical connection assemblies 20 are configured to allow the chip disposed on the electrical connection socket and the circuit board to be electrically connected with each other. That is to say, the electrical connection assembly 20 of the present disclosure can be used as a probe of the electrical connection socket.

The main body 201 is a conductive rod structure. As shown in FIG. 4 and FIG. 5, two ends of the main body 201 are respectively defined as a contacting end 201A and a tail end 201B. The contacting end 201A is configured to be in contact with the device under test. The main body 201 has a limiting protrusion 2011 (the limiting protrusion 2011 is an annular structure in FIG. 4, but the present disclosure does not limit the structure of the limiting protrusion 2011) near the contacting end 201A. The limiting protrusion 2011 divides the main body 201 into an exposed section 201C and a concealed section 201D that is surroundingly concealed by and within the main body 201. An outer diameter D1 of the limiting protrusion 2011 is greater than or equal to an outer diameter D2 of the main body 201 within the exposed section 201C. The outer diameter D1 is greater than an outer diameter D31 and an outer diameter D32 of the main body 201 within the concealed section. The outer diameter D1 of the limiting protrusion 2011 is greater than an outer diameter D4 of the spring 202.

A fixing section 201E of the main body 201 is divided from the concealed section 201D, and the fixing section 201E is near the limiting protrusion 2011. The outer diameter D31 of the main body 201 within the fixing section 201E is greater than the outer diameter D32 of the main body 201 within the concealed section 201D excluding the fixing section 201E. Although the main body 201 has the fixing section 201E in the present embodiment, in a practical application, the main body 201 can be provided without the fixing section 201E according to different assembling manners of the main body 201 and the spring 202.

The spring 202 is sleeved around the concealed section 201D of the main body 201, one end of the spring 202 is abutted against the limiting protrusion 2011, and the spring 202 is limited by the limiting protrusion 2011 so that the spring 202 cannot leave the main body 201 from the contacting end 201A of the main body 201. That is to say, the spring 202 is not sleeved around the exposed section 201C of the main body 201.

The spring has a first end 202E1 and a second end 202E2 respectively defined by two opposite ends of the spring 202. The first end 202E1 of the spring 202 is correspondingly abutted against the limiting protrusion 2011. The spring 202 is divided into a first tightly-coiled section 202A, an elastic section 202B, and a second tightly-coiled section 202C sequentially from the first end 202E1 to the second end 202E2.

Referring to FIG. 5, a pitch of the spring 202 within the first tightly-coiled section 202A and a pitch of the spring 202 within the second tightly-coiled section 202C are less than a pitch of the spring 202 within the elastic section 202B. In a practical application, the pitch of the spring within the first tightly-coiled section 202A or within the second tightly-coiled section 202C can approach zero. That is to say, whether the spring 202 is pressed or not, the spring 202 does not deform within the first tightly-coiled section 202A or the second tightly-coiled section 202C.

An inner diameter D5 of the spring 202 within the first tightly-coiled section 202A is less than the outer diameter D31 of the main body 201 within the fixing section 201E. When the spring 202 is sleeved around the concealed section 201D of the main body 201, the first tightly-coiled section 202A of the spring 202 and the fixing section 201E of the main body 201 are correspondingly fixed with each other, and one end of the spring 202 near the first tightly-coiled section 202A is correspondingly abutted against one side of the limiting protrusion 2011. That is to say, since the inner diameter D5 of the spring 202 within the first tightly-coiled section 202A and the outer diameter D31 of the main body 201 within the fixing section 201E cooperate with each other, one end of the spring 202 can be fixed to the fixing section 201E of the main body 201.

When the spring sustains an external force, the elastic section 202B of the spring 202 elastically deforms and correspondingly generates an elastic returning force, and when the spring 202 is no longer pressed, the elastic returning force allows the elastic section 202B of the spring 202 to return to an initial position. That is to say, the elastic section 202B of the spring 202 is mainly configured to provide the elastic returning force so that the spring 202 returns to the initial position. In a practical application, a length of the spring 202 within the first tightly-coiled section 202A, a length of the spring 202 within the elastic section 202B, and a length of the spring 202 within the second tightly-coiled section 202C can be changed according to practical requirements, and FIG. 3 to FIG. 7 only show one of the embodiments of the present disclosure.

Figure 6:
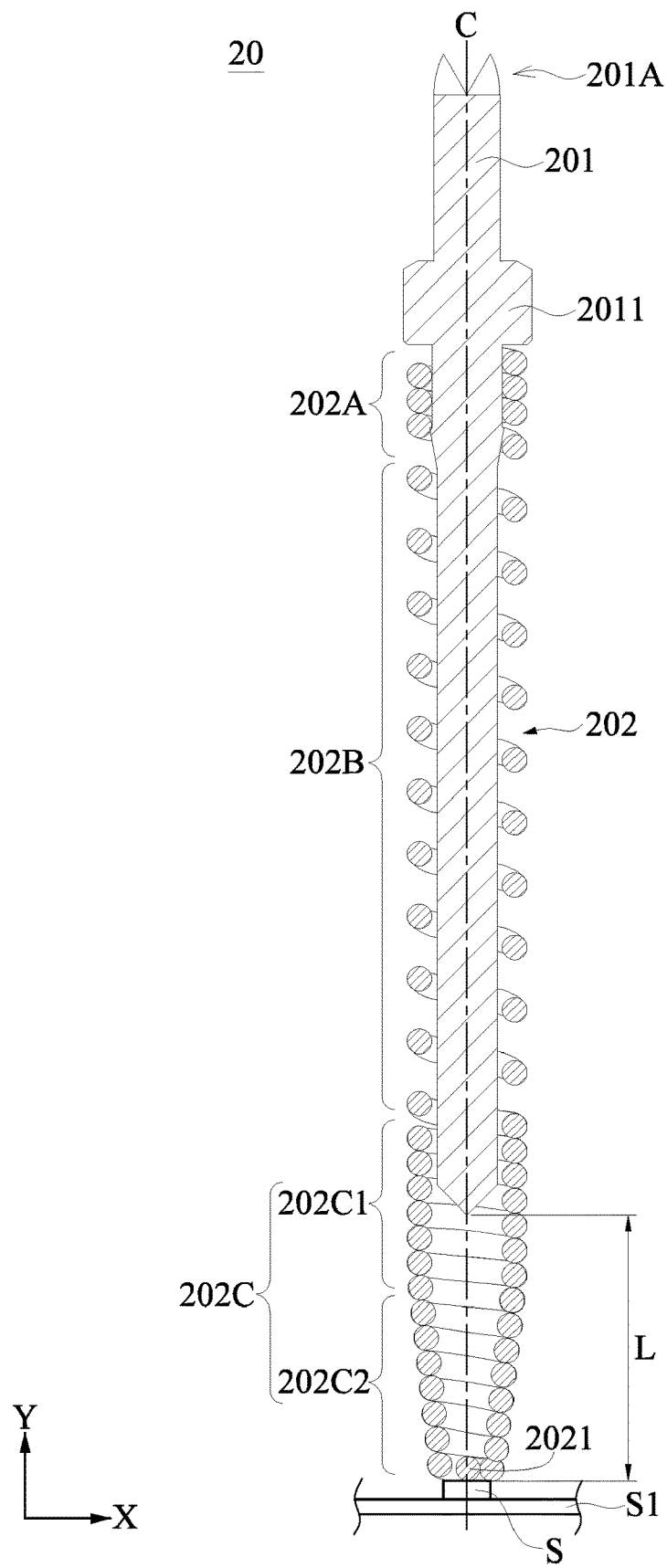
FIG. 6 is a cross-sectional view showing one end of the electrical connection assembly of the present disclosure being fixed on a circuit board.

An isodiametric section 202C1 and a tapered section 202C2 of the spring 202 are divided from the section tightly-coiled section 202C. An outer diameter of the spring 202 within the isodiametric section 202C1 is uniform, and an outer diameter of the spring 202 within the tapered section 202C gradually decreases. A minimum inner diameter D6 of the spring 202 within the tapered section 202C is less than the outer diameter D32 of the main body 201 within the concealed section 201D. That is to say, the outer diameter of the spring 202 of the present embodiment changes according to different positions within the tapered section 202C, and the outer diameter of the spring 202 is basically uniform at positions excluding the tapered section 202C. Moreover, a difference L (as shown in FIG. 6) between a length along an axial direction (i.e. a y-axis direction shown in FIG. 5) when the spring 202 is not pressed and a length of the concealed section 201D of the main body 201 along the axial direction (i.e. the y-axis direction shown in FIG. 5) is greater than an elastic stroke of the spring 202, and the spring 202 is configured to elastically deform with the elastic stroke. That is to say, the spring 202 elastically deforms after sustaining an external force, and when the spring 202 no longer deforms elastically from the external force, the tail end 201B of the main body 201 is still correspondingly arranged inside of the spring 202, and the tail end 201B of the main body 201 does not penetrate through the spring 202.

In a practical application, a minimum outer diameter of the spring 202 within the tapered section 202C2 can be 0.6 to 0.8 of a maximum outer diameter of the spring 202 within any other section aside from the tapered section 202C2.

Figure 7:
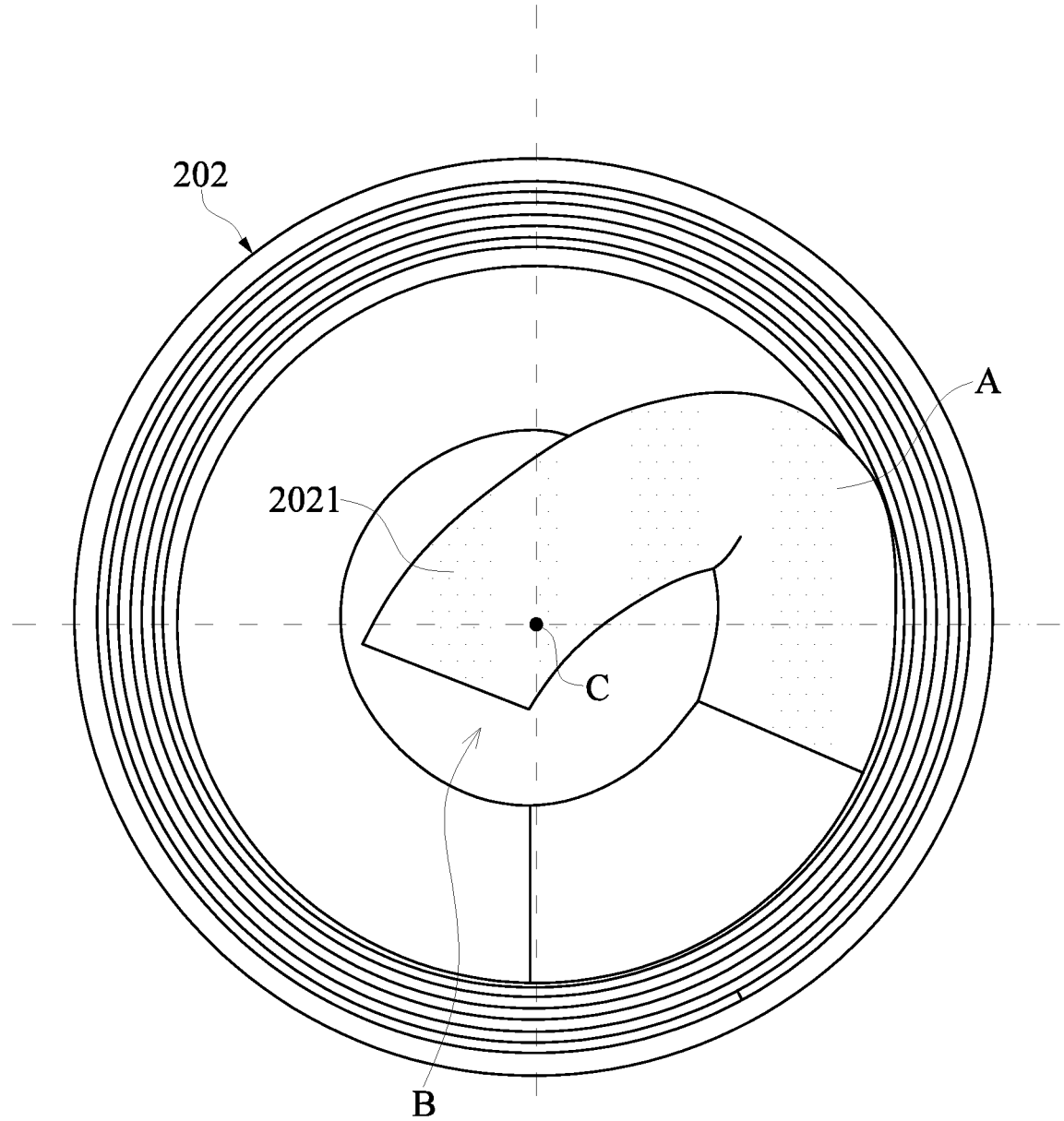
FIG. 7 is a bottom view of a second end of a spring of the electrical connection assembly of the present disclosure.

Referring to FIG. 6 and FIG. 7, FIG. 6 is a cross-sectional view showing one end of the electrical connection assembly of the present disclosure being fixed on a circuit board, and FIG. 7 is a bottom view of a second end of a spring of the electrical connection assembly of the present disclosure. Through the second end 202E2 of the spring 202, the electrical connection assembly 20 and a contacting portion S1 of the circuit board S are fixed with each other. A length of the main body 201 along the axial direction (i.e. the y-axis direction shown in FIG. 6) is less than the length of the spring 202 along the axial direction. Therefore, when the electrical connection assembly 20 is fixed onto the circuit board S and the contacting end 201A of the main body 201 is not pressed, the tail end 201B of the main body 201 is correspondingly arranged inside of the spring 202. In a practical application, when the spring 202 is not pressed, the tail end 201B of the main body 201 can be correspondingly arranged at the tapered section 202C2 or the isodiametric section 202C1.

The spring 202 is formed by a wire body spirally rotating relative to a central axis C, an end of the wire body bends toward the central axis C to form an end portion 2021, and the end portion 2021 is arranged at a position of the second tightly-coiled section 202C away from the first end 202E1 of the spring 202. The end portion 2021 is configured to be mutually fixed with the contacting portion S1 of the circuit board S. That is to say, the end portion 2021 that is configured to be mutually fixed with the contacting portion S1 of the circuit board S is formed at an end of the second end 202E2 of the spring 202.

Referring to FIG. 5 to FIG. 7, the end portion 2021 is formed by being bent toward the central axis C. Therefore, when the second end 202E2 of the spring 202 is in contact with the contacting portion S1 of the circuit board S, a dot region A shown in FIG. 7 can be a region where the contacting portion S1 of the circuit board S contacts. Through the end portion 2021 formed by bending an end of the spring 202 toward the central axis C of the spring 202, an area where the electrical connection assembly 20 contacts the contacting portion S1 of the circuit board S can be effectively increased. Therefore, a probability of the electrical connection assembly 20 being correctly fixed onto the circuit board S can be effectively increased.

Referring to FIG. 6 and FIG. 7, in a practical application, in the bottom view of one end of the end portion 2021 of the spring 202, the end portion 2021 correspondingly passes through the central axis C, and the end portion 2021 extensively covers a hollow region B defined by the spring 202 surrounding the central axis C. Through the above design, when the end portion 2021 of the spring 202 is fixed onto the contacting portion S1, the end portion 2021 can easily be in contact with the contacting portion S1, and an assembling speed of the electrical connection assembly 20 and the circuit board S can be effectively increased.

As mentioned above and referring to FIG. 2, the conventional electrical connection assembly contacts the contacting portion of the circuit board through the end surface of the contacting structure 1121. Therefore, in a process where the end surface of the contacting structure 1121 is to contact the circuit board, it would be difficult for the contacting structure 1121 to correctly contact the contacting portion of the circuit board.

Figure 2:
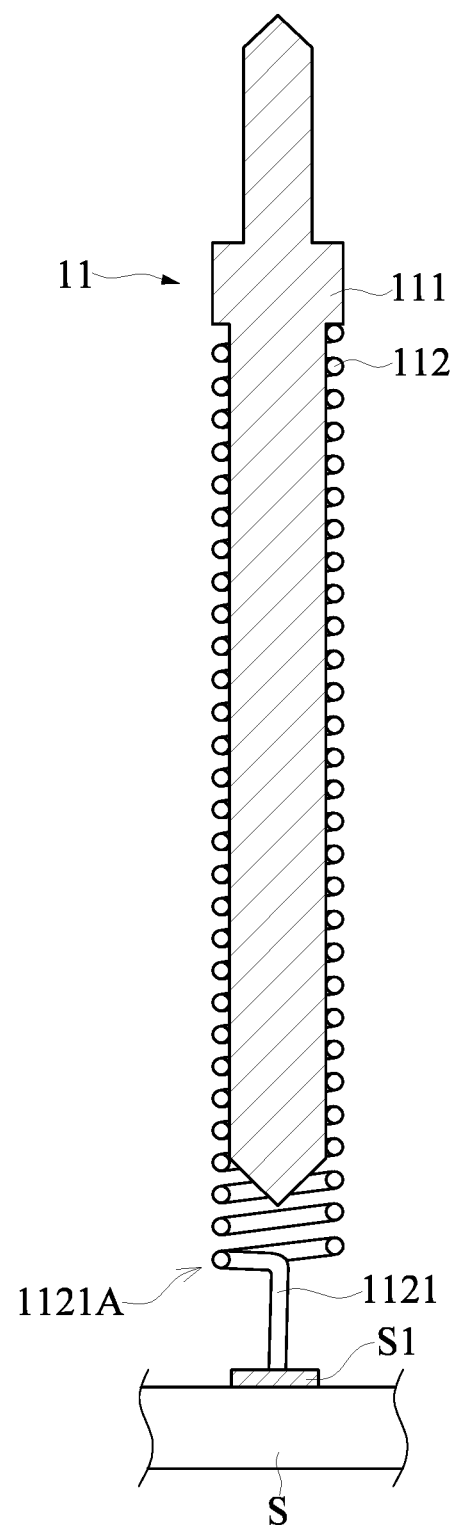

It is worth mentioning that about the conventional electrical connection assembly shown in FIG. 2, when the contacting structure 1121 and the contacting portion of the circuit board are being fixed with each other, a fracture issue can easily occur at a connection position where the contacting structure 1121 is in contact with the spring 202. On the contrary, the fracture issue shown in FIG. 2 does not easily occur at the end portion 2021 of the electrical connection assembly 20 of the present disclosure when the end portion 2021 is in contact with the contacting portion of the circuit board.

It should be noted that the outer diameter of the spring 202 of the present disclosure is within a range of 0.05 mm to 3 mm. That is to say, the electrical connection assembly 20 is provided to improve on issues relating to the conventional electrical connection assembly having a small size.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An electrical connection assembly, comprising:
a main body which is a conductive rod structure, wherein two ends of the main body are respectively defined as a contacting end and a tail end, the contacting end is configured to be in contact with a device under test, the main body has a limiting protrusion near the contacting end, and the limiting protrusion divides the main body into an exposed section and a concealed section; and
a spring which is a conductive structure and sleeved around the main body, wherein two ends of the spring are respectively defined as a first end and a second end, the first end is abutted against the limiting protrusion, and the concealed section of the main body is correspondingly arranged inside of the spring, wherein the spring has a first tightly-coiled section, an elastic section, and a second tightly-coiled section in sequence from the first end to the second end, wherein a pitch of the spring within the elastic section is greater than a pitch of the spring within the first tightly-coiled section, and the pitch of the spring with the elastic section is greater than a pitch of the spring within the second tightly-coiled section, and wherein an outer diameter of the spring is within a range of 0.05 mm to 3 mm,
wherein the spring is formed by a wire body spirally rotating relative to a central axis, an end of the wire body bends toward the central axis to form an end portion, and the end portion is arranged at a position of the second tightly-coiled section away from the first end of the spring,
wherein when one end of the spring is fixed and another end of the spring is pressed, the elastic section elastically deforms, and when the spring is no longer pressed, an elastic returning force generated by the elastic section allows the spring to return to an initial position, and
wherein a fixing section of the main body is divided from the concealed section, an outer diameter of the main body within the fixing section is greater than an outer diameter of the main body within the concealed section excluding the fixing section, an inner diameter of the spring within the first tightly-coiled section is less than the outer diameter of the main body within the fixing section, and when the one end of the spring is abutted against the limiting protrusion, the first tightly-coiled section and the fixing section of the main body are correspondingly fixed with each other.

2. The electrical connection assembly according to claim 1, wherein a tapered section of the spring is divided from the second tightly-coiled section, and an outer diameter of the spring within the tapered section gradually decreases.

3. The electrical connection assembly according to claim 2, wherein a minimum outer diameter of the spring within the tapered section is less than the outer diameter of the main body within the concealed section.

4. The electrical connection assembly according to claim 2, wherein a minimum outer diameter of the spring within the tapered section is 0.6 to 0.8 of a maximum diameter of the spring within any other section aside from the tapered section.

5. The electrical connection assembly according to claim 2, wherein the tapered section is arranged at the second end of the spring, and the end portion of the spring is formed at one end of the tapered section.

6. The electrical connection assembly according to claim 2, wherein a difference between a length of the spring along an axial direction when the spring is not pressed and a length of the concealed section of the main body along the axial direction is greater than an elastic stroke of the spring.

* * * * *